(12) United States Patent
Holme et al.

(10) Patent No.: US 9,293,255 B2
(45) Date of Patent: Mar. 22, 2016

(54) SOLID STATE ENERGY STORAGE DEVICES

(71) Applicant: QuantumScape Corporation, San Jose, CA (US)

(72) Inventors: Tim Holme, Mountain View, CA (US); Friedrich B. Prinz, Woodside, CA (US); Weston Arthur Hermann, Palo Alto, CA (US); Joseph Han, Redwood City, CA (US); Rainer Fasching, Mill Valley, CA (US)

(73) Assignee: QuantumScape Corporation, San Jose, CA (US)

( * ) Notice: Subject to any disclaimer, the term of this patent is extended or adjusted under 35 U.S.C. 154(b) by 0 days.

(21) Appl. No.: 14/700,048

(22) Filed: Apr. 29, 2015

(65) Prior Publication Data

US 2015/0235768 A1    Aug. 20, 2015

Related U.S. Application Data

(63) Continuation of application No. 13/749,706, filed on Jan. 25, 2013, now Pat. No. 9,087,645.

(60) Provisional application No. 61/592,517, filed on Jan. 30, 2012.

(51) Int. Cl.
*H01G 4/10*    (2006.01)
*H01G 4/12*    (2006.01)
*H01G 4/228*   (2006.01)

(52) U.S. Cl.
CPC . *H01G 4/10* (2013.01); *H01G 4/12* (2013.01); *H01G 4/228* (2013.01)

(58) Field of Classification Search
CPC ......... H01G 4/10; H01G 4/20; H01G 4/1209; H01G 4/1227; H01G 4/12; H01G 4/08; H01G 4/30; H01L 28/56
See application file for complete search history.

(56) References Cited

U.S. PATENT DOCUMENTS

| | | | |
|---|---|---|---|
| 4,945,449 | A | 7/1990 | Cansell et al. |
| 5,471,364 | A | 11/1995 | Summerfelt et al. |
| 7,091,548 | B2 | 8/2006 | Jeong et al. |
| 8,377,586 | B2 | 2/2013 | Yazami |
| 2002/0080551 | A1 | 6/2002 | Kitagawa et al. |
| 2003/0118897 | A1 | 6/2003 | Mino et al. |
| 2005/0161717 | A1 | 7/2005 | Nakamura et al. |

(Continued)

FOREIGN PATENT DOCUMENTS

| | | |
|---|---|---|
| CA | 849697 A | 8/1970 |
| WO | 2010048405 | 4/2010 |
| WO | 2013009772 | 1/2013 |

OTHER PUBLICATIONS

U.S. Appl. No. 13/749,706, Non-Final Office Action mailed on Apr. 21, 2014, 23 pages.

(Continued)

*Primary Examiner* — David M Sinclair
(74) *Attorney, Agent, or Firm* — Squire Patton Boggs (US) LLP

(57) ABSTRACT

Described in this patent application are devices for energy storage and methods of making and using such devices. In various embodiments, blocking layers are provided between dielectric material and the electrodes of an energy storage device. The block layers are characterized by higher dielectric constant than the dielectric material. There are other embodiments as well.

12 Claims, 10 Drawing Sheets

(56) References Cited

U.S. PATENT DOCUMENTS

| | | |
|---|---|---|
| 2007/0222534 A1 | 9/2007 | Hannah |
| 2008/0160712 A1 | 7/2008 | Park |
| 2008/0218940 A1 | 9/2008 | Singh et al. |
| 2008/0277761 A1 | 11/2008 | Mahalingam et al. |
| 2009/0022445 A1 | 1/2009 | Hochberg et al. |
| 2009/0130457 A1 | 5/2009 | Kim et al. |
| 2010/0027192 A1 | 2/2010 | Perry et al. |
| 2010/0183919 A1 | 7/2010 | Holme et al. |
| 2010/0279106 A1 | 11/2010 | Yadav et al. |
| 2011/0110015 A1 | 5/2011 | Zhang et al. |
| 2013/0122683 A1 | 5/2013 | Malhotra et al. |
| 2013/0143087 A1 | 6/2013 | Liu et al. |
| 2013/0194716 A1 | 8/2013 | Holme et al. |
| 2014/0363740 A1 | 12/2014 | Holme et al. |

OTHER PUBLICATIONS

U.S. Appl. No. 13/749,706, Final Office Action mailed on Oct. 9, 2014, 20 pages.

Extended European Search Report on May 14, 2013 in European Patent Application No. 13153146.9, 8 pages.

International Search Report of PCT/US2012/046105 mailed on Nov. 9, 2012, 4 pages.

Office Action mailed Apr. 10, 2015 in U.S. Appl. No. 13/749,706, 9 pages.

SOLID STATE ENERGY STORAGE DEVICES

CROSS-REFERENCES TO RELATED APPLICATIONS

This application is a continuation of application Ser. No. 13/749,706, filed Jan. 25, 2013, entitled "SOLID STATE ENERGY STORAGE DEVICES," which claims priority to Application No. 61/592,517, filed Jan. 30, 2012, the contents of which are hereby incorporated in their entirety by reference for all purposes.

BACKGROUND OF THE INVENTION

Described in this patent application are devices for energy storage and methods of making and using such devices.

In general, a capacitive energy storage device comprises two electrodes with a dielectric material disposed between the electrodes. FIG. 1 is a simplified diagram illustrating a capacitive energy storage device. As shown in FIG. 1, dielectric material 103 is positioned between the electrodes 101 and 102. Upon application of a voltage across the electrodes the dielectric material becomes polarized and charges are stored on the electrode plates.

Unfortunately, conventional energy storage devices are inadequate, as explained below. It is desirable to have new and improved energy storage devices.

BRIEF SUMMARY OF THE INVENTION

Described in this patent application are devices for energy storage and methods of making and using such devices. In various embodiments, blocking layers are provided between dielectric material and the electrodes of an energy storage device. The block layers are characterized by higher dielectric constant than the dielectric material. There are other embodiments as well.

In an embodiment, the present invention provides an energy storage device that includes first and second electrodes that are spaced apart. A dielectric layer is disposed between the first and second electrodes. A first blocking layer is disposed between the first electrode and the dielectric layer and a second blocking layer is disposed between the second electrode and the dielectric layer. The dielectric constants of the first and second blocking layers are both independently greater than the dielectric constant of the dielectric layer.

Depending on the application, the dielectric material may different relative permittivity, which can be between about 2 and 25, between about 3 and 15, or other range. The dielectric layer can have a material characterized by a band gap of greater than 4 eV. The dielectric layer can also have a material characterized by a breakdown field strength of greater than 0.5V/nm.

The dielectric layer may comprise a material selected from oxides, nitrides, oxynitrides and fluorides. The dielectric layer may also comprise a material selected from $SiO_2$, $Al_2O_3$ or $Si_3N_4$.

The blocking layers, with higher relative dielectric constant, can have a relative permittivity of greater than 20. The material of the block layers can have a band gap of less than 4 eV, and the breakdown field strength can be between 1 mV/nm and 200 mV/nm. Depending on the application, the first and second blocking layers may independently comprise a material selected from ionically conducting materials and non-ionically conducting materials. Depending on the application, the ionically conducting material can be selected from $Li^+$, $H^+$, $Mg^{2+}$, $Na^+$, $O^-$, $F^-$ conductors, $Li_3PO_4$, and $Li_3PO_{4-x}N_x$. The non-ionically conducting materials can be multiferroic high k materials, such as $CaCu_3Ti_4O_{12}$, $La_2$ nanocomposite high-k materials, high-k ceramic materials, ferroelectric perovskites materials, PZT ($Pb(Zr_{0.5}Ti_{0.5})O_3$), $SrTiO_3$, $PbTiO_3$, $BaTiO_3$, $(BaSr)TiO_3$, or others.

The first and second blocking layers independently comprises a material having a dielectric constant between 10 and 10000 times the dielectric constant of the material comprising the dielectric layer. In a specific embodiment, the first and second blocking layers independently comprise a material having a dielectric constant between 50 and 1000 times the dielectric constant of the material comprising the dielectric layer. The first and second blocking layers independently may have a thickness of between 4 nm and 100 nm. In a specific embodiment, the dielectric layer has a thickness of between 10 nm and 10 um. The first and second blocking layers independently may have a thickness of between 10 and 1000 times the thickness of the dielectric layer.

It is to be appreciated that the block layer and dielectric layer material vary depending on the application. In an embodiment, the first and second blocking layers are both PZT and the dielectric layer is $SiO_2$. In another embodiment, the first and second blocking layers are both LiPON and the dielectric layer is $SiO_2$. In another embodiment, the first and second blocking layers are both LiPON and the dielectric layer is $Li_2O$. In yet another embodiment, the first and second blocking layers are both LiPON and the dielectric layer is LiF.

The blocking layers can also have different material. In an embodiment, the first blocking layer comprises a cation conducting material and the second blocking layer comprises an anion conducting material. In another embodiment, the first blocking layer comprise an anion conducting material and a cation conducting material. In yet another embodiment, the second blocking layer comprise an anion conducting material and a cation conducting material.

With the structure described above, the device can have an energy density of between 5 and 1000 Whr/kg, an energy density of between 10 and 650 Whr/kg, or an energy density of between 50 and 500 Whr/kg. In certain embodiment, an energy density can greater than 50 Whr/kg, or greater than 100 Whr/kg.

The first electrode can have a work function greater than the work function of the second electrode. The work function of the first electrode can be greater than 4.0 eV and the work function of the second electrode can be less than 4.5 eV.

It is to be appreciated that embodiments of the present invention provides various advantages over conventional techniques. In this patent application, energy storage devices are capable of sustaining higher field strengths than conventional capacitive energy storage devices and which may therefore be used for high energy density capacitive energy storage. More specifically, energy storage devices according to the present invention are capable of withholding higher breakdown voltages (and therefore improved stability and reliability) compared to conventional devices, a thereby allowing a higher level of energy density. There are other benefits as well as described below.

DETAILED DESCRIPTION OF THE INVENTION

Described in this patent application are devices for energy storage and methods of making and using such devices. In various embodiments, blocking layers are provided between dielectric material and the electrodes of an energy storage device. The block layers are characterized by higher dielectric constant than the dielectric material. There are other embodiments as well.

Capacitive energy storage has well-known advantages versus electrochemical energy storage, e.g. in a battery. Compared to batteries, capacitors are able to store energy with very high power density, i.e. charge/recharge rates, have long shelf life with little degradation, and can be charged and discharged (cycled) hundreds of thousands or millions of times. However, capacitors often do not store energy in as little volume or weight as in a battery, or at low cost per energy stored, making capacitors impractical for applications such as in electric vehicles. Accordingly, it would be an advance in energy storage technology to provide a capacitive energy storage capable of storing energy more densely per volume and/or mass.

Figure 1:
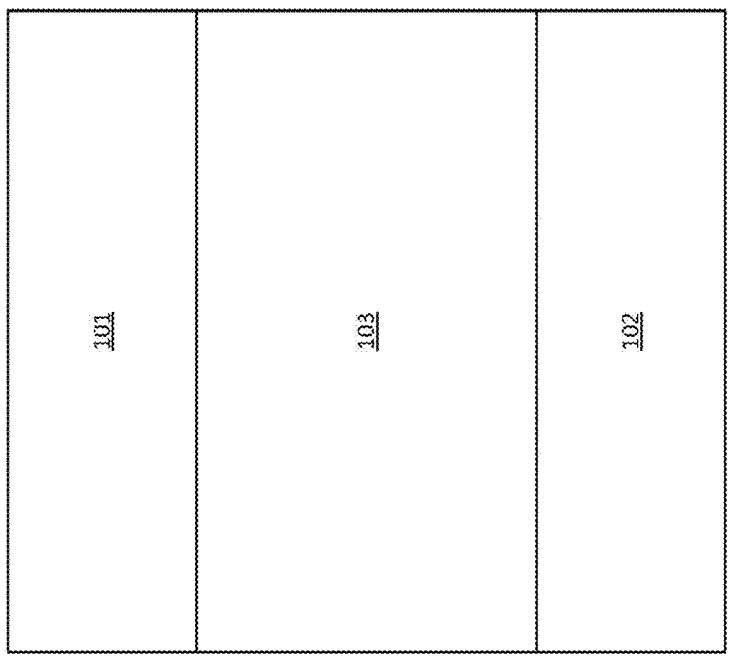
FIG. 1 is a simplified diagram illustrating a capacitive energy storage device.
Figure 2:
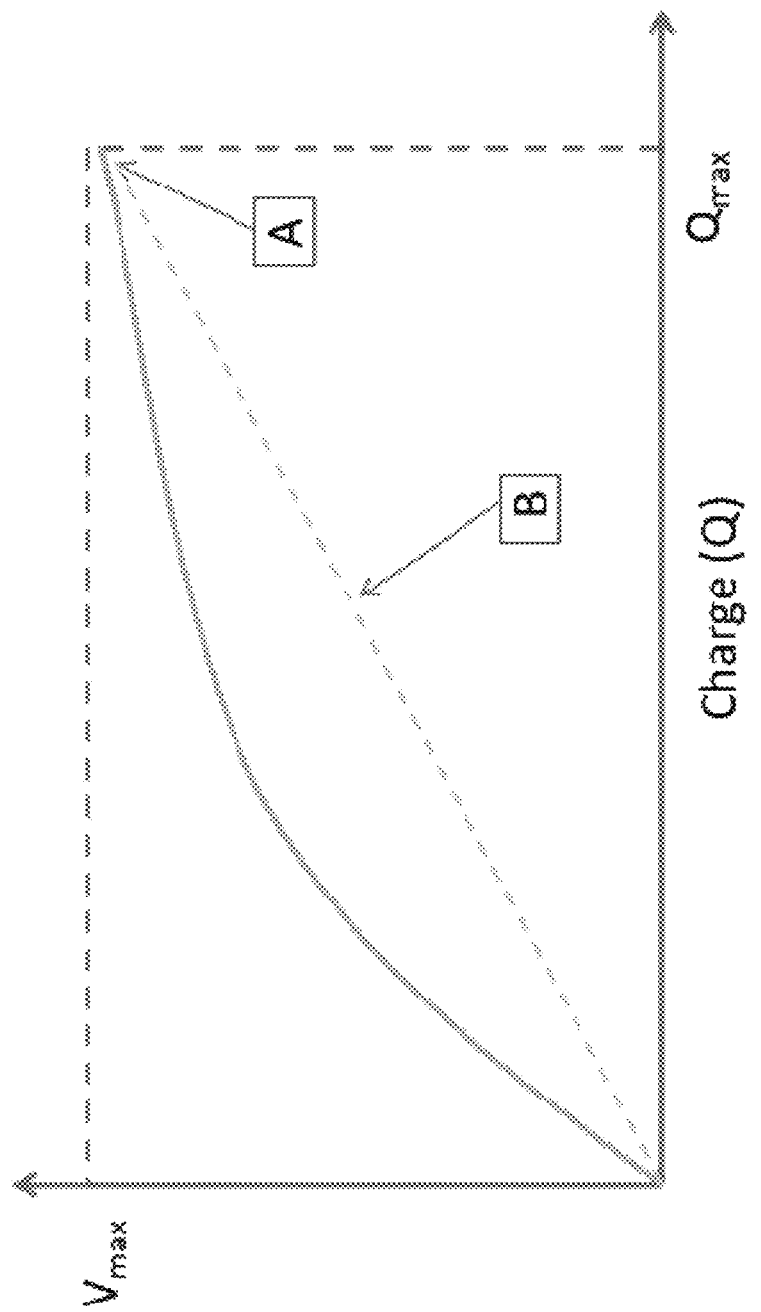
FIG. 2 shows exemplary current voltage curves for a capacitive energy storage device.

FIG. 2 shows exemplary current voltage curves for a capacitive energy storage device. Generally the voltage across the electrodes, V, will be some function of the charge stored on the electrodes, Q, as shown in the solid line curve in FIG. 2. There will be some maximum voltage, $V_{max}$, up to which the device can be charged before the dielectric material starts to breakdown. For linear materials the capacitance does not depend on Q and V(Q)=Q/C as shown in the dotted line B in FIG. 2.

The total energy stored in the device is generally given by:

$$\text{Total Energy} = \int_V^{Qmax} V(Q)dQ \quad (1)$$

which for linear materials reduces to:

$$\text{Total Energy} = \frac{1}{2} C^* V_{max}^2 \quad (2)$$

The capacitance, C, is equal to the area of electrodes, A, times the permittivity, $\in$, of the dielectric material divided by the distance between the electrodes, d. The energy density of the device, ρ, can therefore be written as $$\rho = \frac{1}{2} \in^* E_{max}^2 \quad (3)$$

where $E_{max}$ is the maximum sustainable field in the dielectric material and is equal to $V_{max}/d$.

Figure 3:
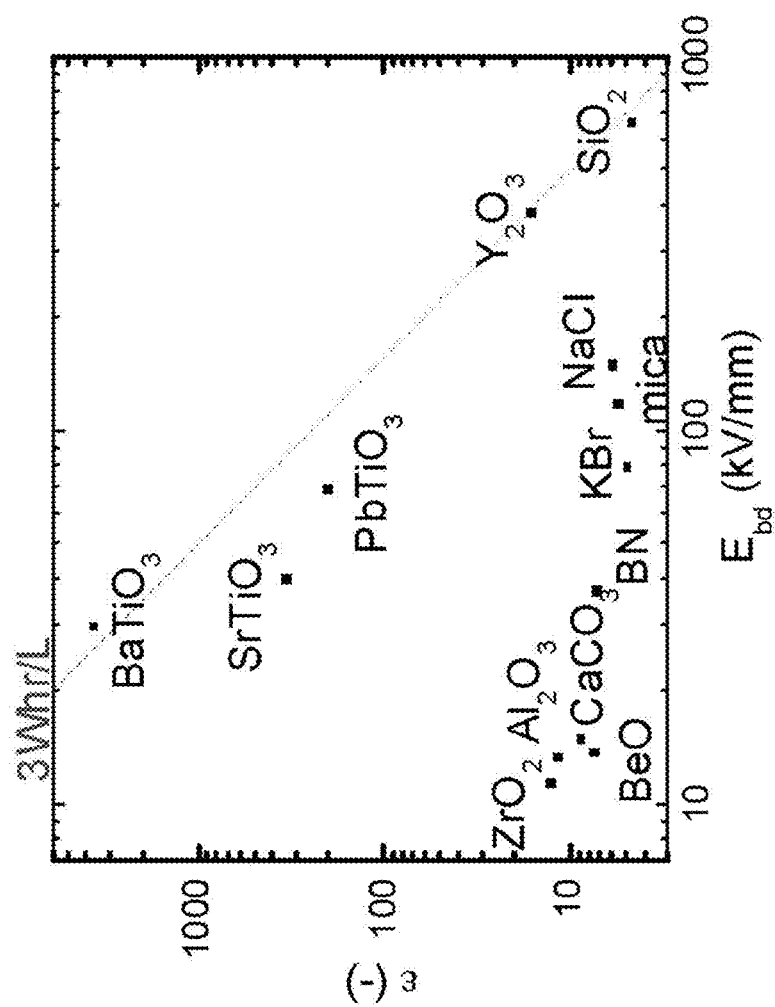
FIG. 3 shows the permittivity and breakdown field strength of a number of common dielectrics.

As can be seen in equation 3, the energy density of a device may be increased by increasing the permittivity of the dielectric material and/or by increasing the maximum field sustainable in the dielectric material. Capacitive energy storage has been limited by the relatively low field strengths sustainable in conventional high permittivity dielectric materials as shown in FIG. 3, which shows the permittivity and breakdown field strength of a number of common dielectrics. The dotted line on FIG. 3 indicates that the energy density of standard dielectric materials is limited to about 3 Wh/L.

In this patent application are described energy storage devices capable of sustaining higher field strengths than conventional capacitive energy storage devices and which may therefore be used for high energy density capacitive energy storage.

Figure 4:
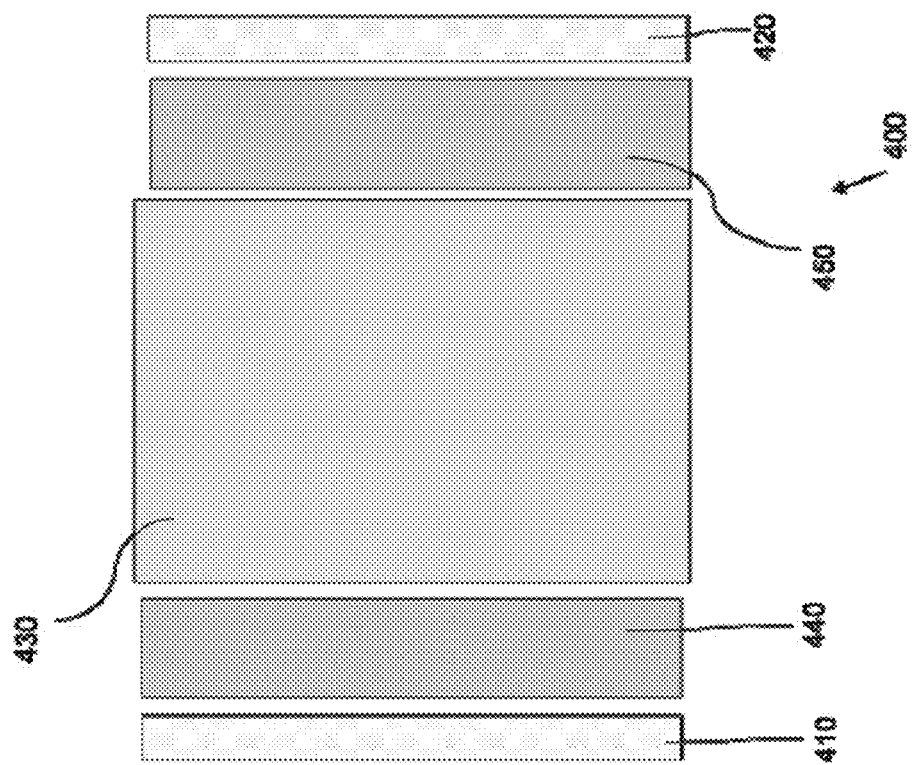
FIG. 4 shows one version of a high energy density energy storage device.

FIG. 4 shows one version of a high energy density energy storage device described herein. The device (400) includes first and second electrodes (410 & 420) spaced apart and a dielectric layer (430) disposed between the electrodes. The device also includes blocking layer (440) disposed between the first electrode and the dielectric layer and blocking layer (450) disposed between the second electrode and the dielectric layer. The blocking layers, 440 and 450, are made of materials with higher dielectric constant than that of the material of the dielectric layer. The blocking layers, 440 and 450, may be the same material or may be different materials.

In this patent application the dielectric layer is also referred to as the "low-k material" and the blocking layers is also referred to as the "high-k material." The designations "high" and "low" indicate the relative magnitudes of the dielectric constants of the materials not their absolute values.

Figure 5:
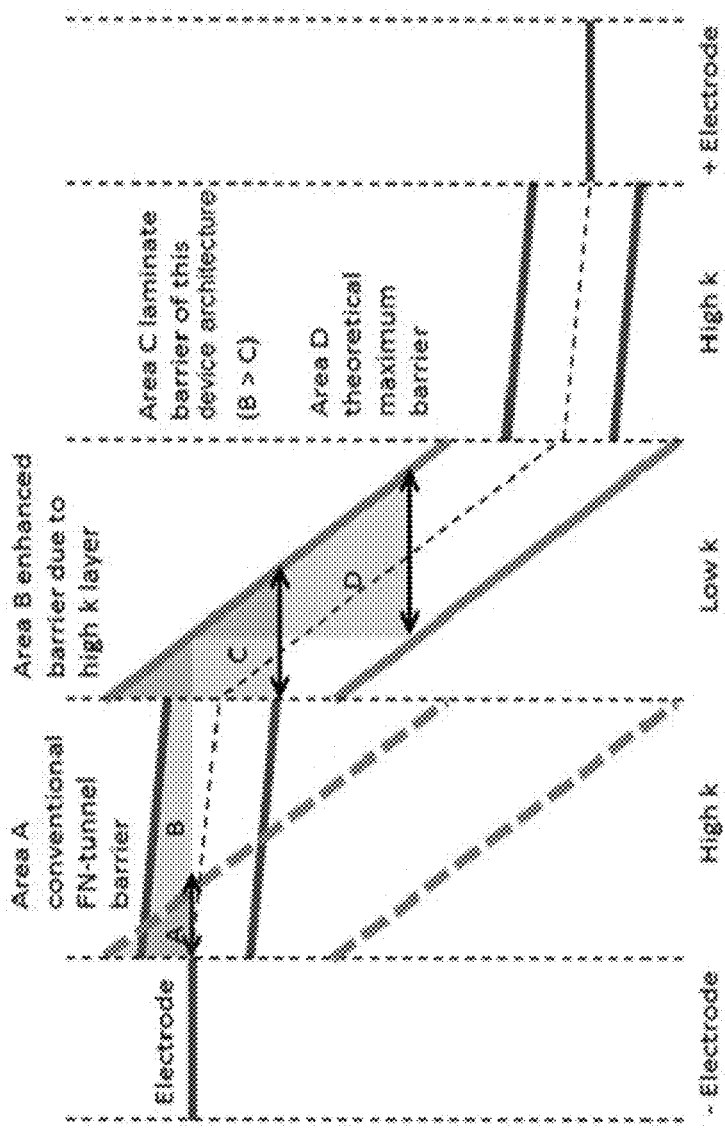
FIG. 5 illustrates energy density due to onset of Fowler-Nordheim tunneling.

Without being bound by theory, it is believed that the structure shown in FIG. 4 has increased breakdown tolerance, and hence higher energy density, because of the suppression by the blocking layers of injection of charge carriers from the electrodes into the dielectric material. As shown in FIG. 5, it is believed that this device may have high energy density because the onset of Fowler-Nordheim (FN) tunneling from the electrodes into the dielectric material is delayed to higher voltages. The delay of FN tunneling results from the scarcity of charge carriers at the low-k material interface. FIG. 5 shows that the area B is larger than area A. Tunneling probability of an electron at the interface is inversely related exponentially to the area under the potential barrier (from the WKB approximation). So by increasing the barrier height, the area B will be larger, and the probability of detrimental electron tunneling is exponentially lower. Further, if a double layer is present at the interface, if the double layer has a charge that repels electrons FN tunneling will be further suppressed. For example, if the leftmost high-k layer in the example above has anion conduction, the anions will create a double layer at the high-k/low-k interface, and this negative charge will repel electrons from this interface.

Figure 9:
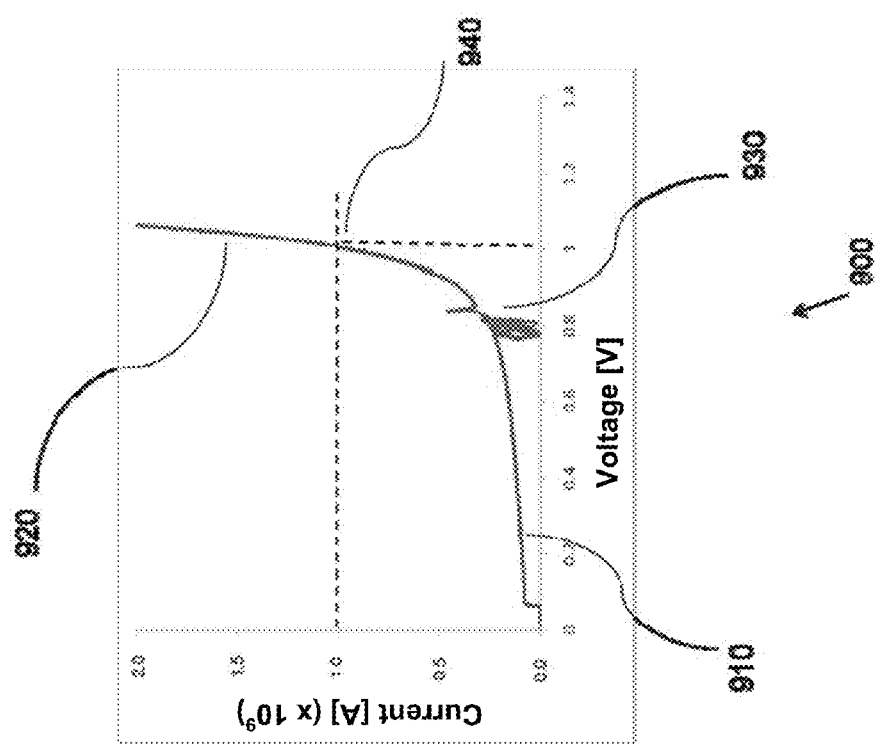
FIG. 9 illustrates breakdown voltage of energy storage devices.

The dielectric layer may generally be made of any dielectric material. In one version of the devices the dielectric layer material has a breakdown field strength of greater than 0.5 V/nm. Breakdown field strength is determined by (i) placing a layer of about 50 nm thickness of the test material between conductive electrodes one of which is approximately circular with a diameter of 100 μm and the other of which is larger than the 100 μm electrode; (ii) applying a linear voltage ramp across the electrodes, ramping up from 0V at a rate of about 0.1V/s; and, (iii) measuring the current flowing between the electrodes as a function of applied voltage. The breakdown voltage is measured at approximately room temperature. A typical current-voltage plot is presented in FIG. 9, showing an initial low voltage region (910) and a breakdown region (920). The breakdown voltage is calculated as the voltage at which the current is ten times the measured capacitive charging current. In FIG. 9, for example, if the capacitive charging current is $10^{-10}$ A the breakdown voltage is about 1V (940) at which the current is $10^{-9}$ A. The breakdown field strength is calculated as the breakdown voltage divided by the thickness of the test material, which may be measured by cross-sectional TEM, X-ray reflectometry (XRR) or ellipsometry. The current fluctuations shown at about 0.8 V (930) are typical of such current-voltage plots and are seen at voltages approaching the breakdown voltage.

In another version of the devices the dielectric layer material has a relative permittivity of less than 15. The relative permittivity is measured by placing a layer of test material of thickness d between two conductive electrodes of area A and scanning the voltage at scan rate s, measuring the capacitive charging current I, and calculating the relative permittivity, $\in$, as the ratio $\in=(I/s)*(d/\in_0 A)$. The relative permittivity is measured at approximately room temperature.

In another version of the devices the dielectric layer material has a band gap of greater than 4 eV. The breakdown field strength, relative permittivity and band gap described in this paragraph are material properties of the material that may be used for the dielectric layer; they are not the material properties of the composite blocking layer/dielectric layer/blocking layer system.

Specific dielectric layer materials that may be used include $SiO_2$, $HfO_2$, $Al_2O_3$, $Si_3N_4$, oxides, nitrides, oxynitrides and fluorides. In one version the dielectric layer material is $SiO_2$, $HfO_2$, $Al_2O_3$ or $Si_3N_4$.

The blocking layer may generally be made of any material having a dielectric constant greater than that of the dielectric constant of the dielectric layer material. In one version of the devices the blocking layer material has a breakdown field strength of between 1 mV/nm and 200 mV/nm. In another version of the devices the blocking layer material has a relative permittivity of greater than 100. In another version of the devices the blocking layer material has a band gap of less than 4 eV. In one version of the device, the blocking layer material is ionically conducting, has an relative permittivity of greater than 100 and a band gap of greater than 3 eV. The breakdown field strength, relative permittivity and band gap described in this paragraph are material properties of the material that may be used for the blocking layer; they are not the material properties of the composite blocking layer/dielectric layer/blocking layer system.

The blocking layer material may be an ionically conducting material or a non-ionically conducting material.

Figure 6:
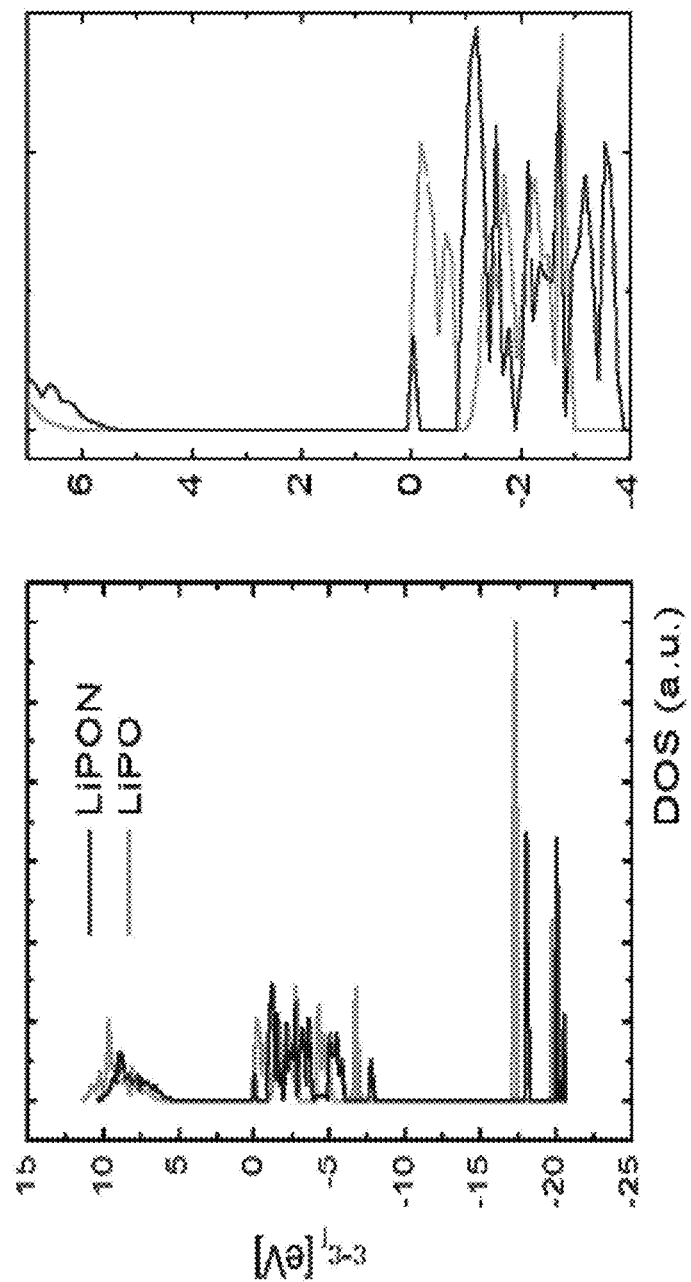
FIG. 6 shows a calculation of the density of states (DOS) of $Li_3PO_4$ and $Li_3PO_{4-x}N_x$ that shows that these materials.

In the case of an ionically conducting blocking layer material, the material derives its permittivity at least in part from ion migration within the material, establishing double layers at each interface. These double layers may be engineered to further deplete the electron concentration at the interface to delay the onset of FN tunneling, as is described in FIG. 5. In one version the ionically conducting material is an anion conductor. In one version the ionically conducting material is a cation conductor. In one version the ionically conducting material is a $Li^+$, $H^+$, $Na^+$, $O^{2-}$ or $F^-$ conductor. In one version the ionically conducting material is a $Li^+$ ion conductor. In one version the ionically conducting material $Li_3PO_4$ or $Li_3PO_{4-x}N_x$. As used in this patent application, LiPON means $Li_3PO_{4-x}N_x$. FIG. 6 shows a calculation of the density of states (DOS) of $Li_3PO_4$ and $Li_3PO_{4-x}N_x$ that shows that these materials, along with having a high relative permittivity, have a high bandgap, further delaying the onset of FN tunneling. In one version of the devices, the first blocking layer is an anion conducting material and the second blocking layer is a cation conducting material.

Figure 8:
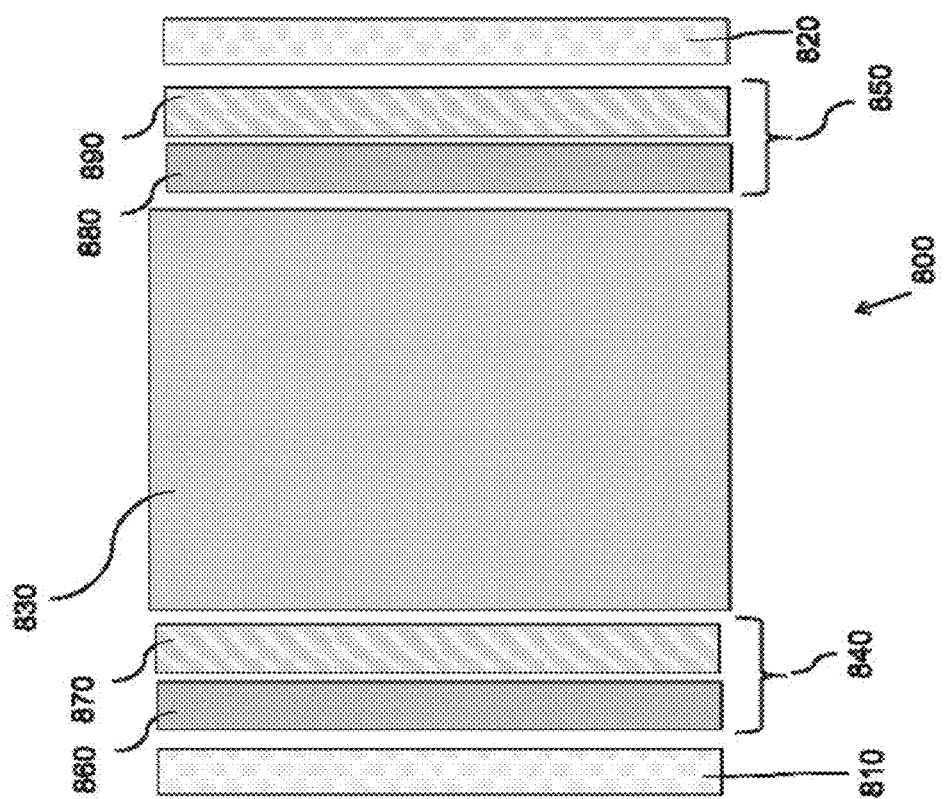
FIG. 8 illustrates a device 800 that includes first and second electrodes, a dielectric layer disposed between them, and first and second blocking layers.

In one version of the devices, one or both of the blocking layers comprises an anion conducting material and a cation conducting material. An example of such device is shown in FIG. 8 in which a device (800) includes first and second electrodes (810 & 820), a dielectric layer (830) disposed between them and first and second blocking layers (840 & 850) disposed between the dielectric layer and the first and second electrodes respectively. The first and second blocking layers include anion conducting material (860 & 880) and cation conducting material (870 & 890). In other versions, only one of the first or second blocking layers includes both cation and anion conducting materials and the other blocking layer includes either a non-ionically conducting material or a cation or anion conducting material. In some version of the devices, independently for the first and second blocking layers the anion conducting material is proximate to the electrode and in other versions of the devices the cation conducting material is proximate to the electrode.

In the case of a non-ionically conducting blocking layer material, the material derives its permittivity at least in part from the intrinsic polarizability of the material. In one version the non-ionically conducting material is a high-k ceramic material. In one version the non-ionically conducting material is a ferroelectric perovskite. In another version the non-ionically conducting material is PZT ($Pb(Zr_{0.5}Ti_{0.5})O_3$). In another version the non-ionically conducting material is $SrTiO_3$, $PbTiO_3$, $BaTiO_3$ or $(BaSr)TiO_3$. In another version the non-ionically conducting material is a multiferroic high k material. In another version the non-ionically conducting material is $CaCu_3Ti_4O_{12}$ or $La_{2-x}Sr_xNiO_4$. In another version the non-ionically conducting material is a nanocomposite high-k material.

As described above, the blocking layer material has a higher dielectric constant than that of the dielectric layer material. In one version of the devices, the dielectric constant of the blocking layer material is between 10 and 10000 times greater than the dielectric constant of the dielectric layer material. In another version the dielectric constant of the blocking layer material is between 100 and 1000 times greater than the dielectric constant of the dielectric layer material.

The electrodes may generally be made of any conducting material that is compatible with the materials of the device with which they have contact. In one version the electrodes may, independently, be made of Pt, Cu, Al, Ag or Au. The electrodes may be of the same or different materials. In one version, the electrodes have different work functions. In one version the electrode that is positively biased during charge has a work function that is lower than that of the work function of the electrode that is negatively biased during charge. In one version the electrode that is positively biased during charge has a work function of less than 4.5 eV. In one version the electrode that is negatively biased during charge has a work function of greater than 4.0 eV.

The blocking layer may generally be of any thickness that maintains the charge carrier injection suppression function of the layer. In one version the blocking layer has a thickness of between 4 nm and 100 nm. The dielectric layer may generally be of any thickness that maximizes energy storage density while maintaining an insulating property under high field. In one version the dielectric layer has a thickness of between 20 nm and 10 μm. As shown in the calculation below it may be advantageous for the dielectric layer to be thicker than the blocking layers. In one version the dielectric layer is between 1 and 1000 times the thickness of the blocking layer.

Calculations have shown that the energy is primarily stored in the material of low-k, as illustrated by the following example:

Exemplary Properties of High k and Low k Materials:

|  |  | High k material | Low k material |
|---|---|---|---|
| Material permittivity |  | 800 | 4 |
| Breakdown Field | V/nm | 0.1 | 20 |
| Max absolute voltage | V | 20000 | — |
| Material density | g/cm$^3$ | 5 | 2.65 |

Calculated Energy Density:

|  | Thickness [nm] | Voltage drop [V] | Field [V/nm] | Energy [Wh/L] | Energy [Wh/kg] |
|---|---|---|---|---|---|
| High k layer 1 | 50 | 5.0 | 0.10 | 9.8 |  |
| Low k layer | 1.00E+03 | 19990.0 | 19.99 | 1964.7 |  |
| High k layer 2 | 50 | 5.0 | 0.10 | 9.8 |  |
| Total | 1100 | 20000 |  | 1787.0 | 624.0 |

The above example illustrates that energy densities exceeding those in state-of-the-art batteries may be achieved with such devices.

Figure 7:
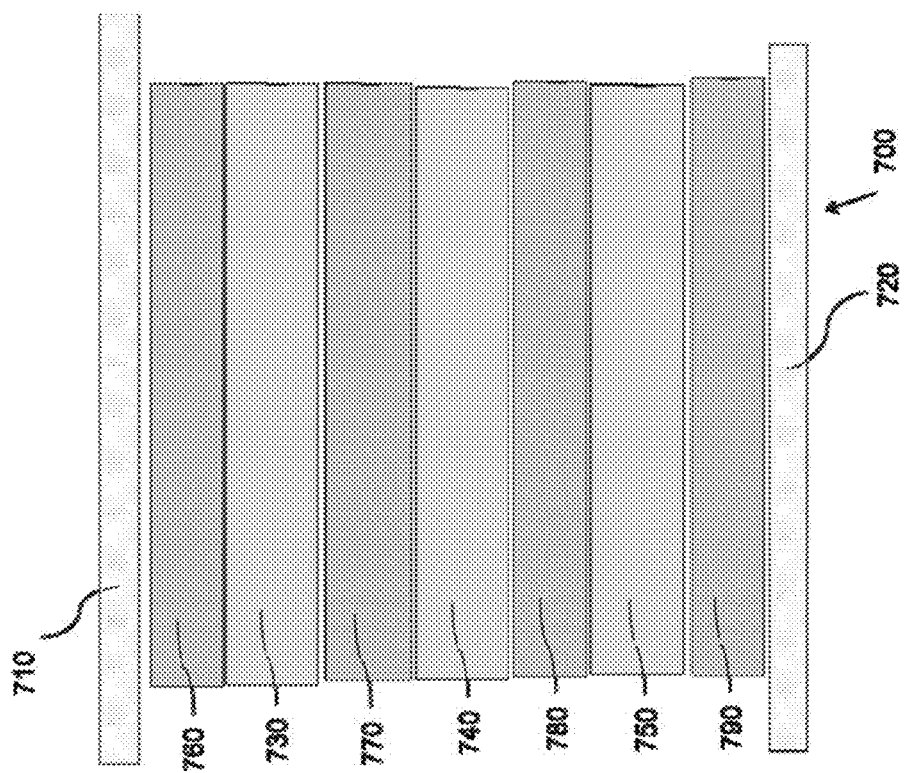
FIG. 7 shows one version of the devices that includes electrodes and and multiple layers of dielectric material separated by layers of blocking material.

Multiple Layer Devices:

FIG. 7 shows one version of the devices, device 700, that includes electrodes 710 and 720 and multiple layers of dielectric material (730, 740, 750) separated by layers of blocking material (760, 770, 780, 790).

Laminate Devices:

In one version of the devices, the dielectric and blocking layers are laminate layers in direct contact with each other with the architectures shown in FIGS. 4, 7 and 8 and as otherwise described herein. In other versions the devices include one or more interfacial layers between one or more of the electrodes, dielectric layer and blocking layers.

Energy Density:

In one version a device as described herein has an energy density of between 5 and 1000 Whr/kg. In another version a device as described herein has an energy density of between 10 and 650 Whr/kg. In another version a device as described herein has an energy density of between 50 and 500 Whr/kg. In another version a device as described herein has an energy density of greater than 50 Whr/kg. As used herein, energy density if the energy density at the device level; i.e., the total energy stored in the device divided by the mass of the device.

Making of the Devices:

The devices described herein may be fabricated in a number of ways, for example using sputtering, PVD, ALD or CVD. In one method of making described herein, the devices are fabricated by sputtering using an Endura 5500, 200 mm by Applied Materials. In one version of the devices, laminate devices are fabricated by sequential deposition of the blocking layers, dielectric layer(s) and electrodes on a substrate. In one version, a substrate is not required and the blocking layers, dielectric layer(s) and electrode layer(s) may be deposited directly on to one of the electrodes.

Uses of the Devices:

The devices described herein may generally be used in any application requiring energy storage. The devices may be particularly well suited for use in applications such as in electric vehicles, hybrid electric vehicles and grid storage and regulation.

Examples of Devices:

Devices may be made with the following dielectric and blocking layers

| Example | Dielectric Layer Material | First Blocking Layer Material | Second Blocking Layer Material |
|---|---|---|---|
| 1 | SiO$_2$ | PZT | PZT |
| 2 | SiO$_2$ | LiPON | LiPON |
| 3 | Li$_2$O | LiPON | LiPON |
| 4 | LiF | LiPON | LiPON |
| 5 | SiO$_2$ | LiPON | YSZ (yttria-stabilized zirconia, $(Y_2O_3)_x(ZrO_2)_{1-x}$ |

In one version of the energy storage devices described herein the high energy density capacitive energy storage materials may have one or more of the following characteristics:

1) Inhibit the onset of Fowler-Nordheim tunneling
2) Provide high breakdown strength
3) Are tolerant of defects arising during fabrication or during high voltage stress 1) High Breakdown Strength In one version, the devices described herein may have high breakdown strength because a) FN tunneling is not dominant, (for example, calculations suggest that other failure mechanisms in SiO$_2$ limit the breakdown tolerance to ~20V/nm) b) the low-k material is intrinsically a high breakdown material (for example, because of high purity, low defect concentration, high bandgap, etc.) c) the electric field is dropped primarily in the low-k material, which has high breakdown strength d) by interleaving thin nano-layers of the low-k material with the high-k material, any free charge carriers in the conduction band may not gain sufficient kinetic energy to cause damage via impact ionization.

2) Defect Tolerance

To increase high voltage breakdown strength, it may be advantageous for the material under voltage stress have a low defect concentration. Defects which introduce states in the middle of the band gap of the insulator can lead to breakdown of the insulator. One mechanism by which defects lead to breakdown is that as defects form in a capacitor near the electrode, the field gets concentrated around those defects, enhancing the current around those defects, which leads to heating (and ionization), which results in further defect creation, forming a positive feedback. In the laminate structure, this feedback between defects and current cannot occur, since the material adjacent to the (defective) insulator is not conducting.

Figure 10:
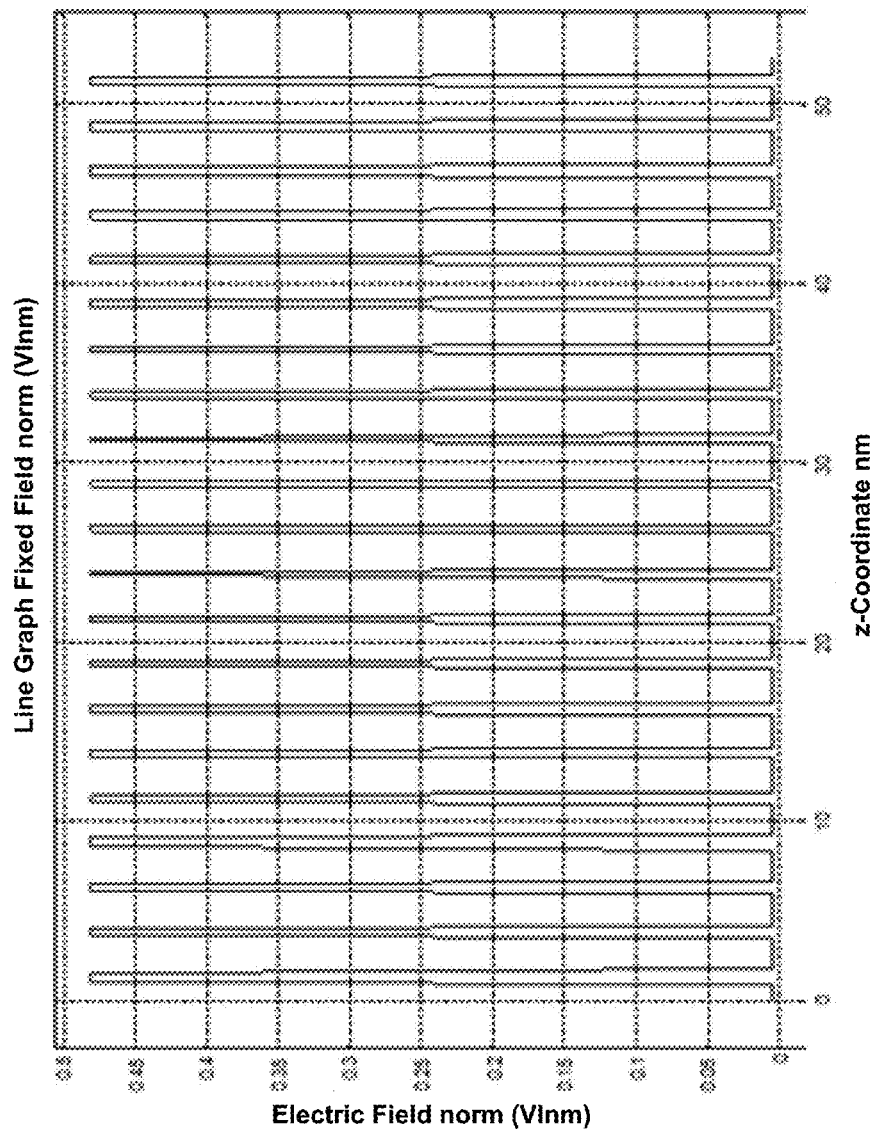
FIG. 10 is a graph illustrating performance of an exemplary energy storage device with $SiO_2$ as dielectric material and PZT as blocking material according to embodiments of the present invention.

FIG. 10 is a graph illustrating performance of an exemplary energy storage device with SiO$_2$ as dielectric material and PZT as blocking material according to embodiments of the present invention. The graph is generated under the following conditions:

Matrix is modeled as "PZT", $\in$=400

$$PZT\ E_{dens}=0.5*400*\in_0*0.1\ V/nm=4.9\ Wh/l$$

blocking layer is modeled as SiO$_2$, $\in$=3.9, which is 0.5 nm with 2.0 nm spacing As illustrated in the graph of FIG. 10, through the thickness of the blocking material, a stable and substantially uniform electric field is maintained at a about 0.48V/nm. When the applied electric field is about 0.1 V/nm, and the energy density is about 0.23 Wh/l. The high $\in$ region has low field, and low $\in$ region has higher field. When the applied electric field is 2.2V/nm, the energy density is at about 112 Wh/l.

In an exemplary embodiment, the blocking layer is characterized by a thickness of 2 nm with 2 nm spacing. When the applied energy is 0.1V/nm, the energy density is at about 0.095 Wh/l. When the applied energy is 5.2V/nm, the energy density is at about 257 Wh/l.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Numerous methods of fabrication of a device as described herein will be obvious to one skilled in the art. As a non-limiting example, one fabrication sequence is generically described below. A conductive substrate, or an insulting substrate with a conductive coating, forms a first electrode. Alternating dielectric and blocking materials are deposited by PVD, sputtering, evaporation, high rate evaporation, close space sublimation, CVD, ALD, PECVD, or solution synthesis such as CBD, precipitation, spray coating, spin coating, roll coating, slot-die, etc. For example, SiO2 may be deposited by sputtering in an Applied Materials Endura 200 mm system by reactive RF sputtering of Si in an oxygen plasma. LiPON may be deposited in a similar fashion from a $Li_3PO_4$ target in a nitrogen plasma. One or more stacks of dielectric/blocking layers may be alternated in turn. A top electrode may be deposited by a solution process, or a vacuum process, for instance one selected from the list provided above. The device may be packaged for reliability and to prevent ingress of oxygen or humidity by any number of techniques common in semiconductor packaging, for example, by alternating layers of parylene and titanium. The electrodes are fed through a hermetic seal as common in battery devices.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An energy storage device comprising:
    first and second electrodes spaced apart;
    a dielectric layer comprising $SiO_2$ or $SiO_xN_y$, and disposed between the first and second electrodes;
    a first blocking layer disposed between the first electrode and the dielectric layer; and
    a second blocking layer disposed between the second electrode and the dielectric layer,
    wherein the dielectric constants of the first and second blocking layers are both independently greater than the dielectric constant of the dielectric layer,
    wherein the thicknesses of the first and second blocking layers are both independently less than the thickness of the dielectric layer,
    and wherein the first and second blocking layers independently comprise a non-ionically conducting material selected from PZT ($Pb(Zr_{0.5}Ti_{0.5})O_3$), $SrTiO_3$, $PbTiO_3$, $BaTiO_3$, $(BaSr)TiO_3$, $CaCu_3Ti_4O_{12}$, and $La_{2-x}Sr_xNiO_4$.

2. The device of claim 1, wherein the thickness of the dielectric layer is between 1 and 1000 times greater than the thicknesses of the first and second blocking layers independently.

3. The device of claim 1, wherein the thickness of the dielectric layer is between 1 and 1000 times greater than the thickness of the first blocking layer.

4. The device of claim 1, wherein the thickness of the dielectric layer is between 1 and 1000 times greater than the thickness of the second blocking layer.

5. The device of claim 1, wherein the thicknesses of the first and second blocking layers are independently between 4 nm and 100 nm.

6. The device of claim 1, wherein the thickness of the dielectric layer is between 10 nm and 10 um.

7. The device of claim 1, wherein the thickness of the dielectric layer is between 20 nm and 10 um.

8. The device of claim 1, wherein the device has an energy density of between 50 and 500 Whr/kg.

9. The device of claim 1, wherein the device has an energy density of greater than 50 Whr/kg.

10. The device of claim 1, wherein the device has an energy density of greater than 100 Whr/kg.

11. The device of claim 1, wherein the first electrode has a work function greater than the work function of the second electrode.

12. The device of claim 1, wherein the work function of the first electrode is greater than 4.0 eV and the work function of the second electrode is less than 4.5 eV.

* * * * *